US011024758B2

(12) United States Patent
Wuerz et al.

(10) Patent No.: US 11,024,758 B2
(45) Date of Patent: Jun. 1, 2021

(54) LAYER STRUCTURE FOR A THIN-FILM SOLAR CELL AND PRODUCTION METHOD

(71) Applicant: Zentrum fuer Sonnenenergie- und Wasserstoff-Forschung Baden Wuerttemberg, Stuttgart (DE)

(72) Inventors: Roland Wuerz, Kernen i.R. (DE); Michael Powalla, Marxzell (DE); Philip Jackson, Tuebingen (DE); Dimitrios Hariskos, Kornwestheim (DE)

(73) Assignee: Zentrum fuer Sonnenenergie- und Wasserstoff-Forschung Baden-Wuerttemberg, Stuttgart (DE)

( * ) Notice: Subject to any disclaimer, the term of this patent is extended or adjusted under 35 U.S.C. 154(b) by 172 days.

(21) Appl. No.: 15/527,392

(22) PCT Filed: Nov. 18, 2015

(86) PCT No.: PCT/EP2015/076996
§ 371 (c)(1),
(2) Date: May 17, 2017

(87) PCT Pub. No.: WO2016/079198
PCT Pub. Date: May 26, 2016

(65) Prior Publication Data
US 2017/0323984 A1 Nov. 9, 2017

(30) Foreign Application Priority Data
Nov. 18, 2014 (DE) .................... 10 2014 223 485.9

(51) Int. Cl.
*H01L 31/032* (2006.01)
*H01L 31/062* (2012.01)
(Continued)

(52) U.S. Cl.
CPC ...... *H01L 31/0326* (2013.01); *H01L 31/0322* (2013.01); *H01L 31/0323* (2013.01);
(Continued)

(58) Field of Classification Search
CPC ............ H01L 31/0322; H01L 31/0323; H01L 31/0326; H01L 31/0327; H01L 31/03923;
(Continued)

(56) References Cited

U.S. PATENT DOCUMENTS 5,125,984 A 6/1992 Kruehler et al.
6,259,016 B1 7/2001 Negami et al.
(Continued)

FOREIGN PATENT DOCUMENTS

DE 44 40 878 A1 7/1996
DE 100 10 177 A1 9/2000
(Continued)

OTHER PUBLICATIONS

English translation of Japanese Office Action issued in counterpart Japanese Application No. 2017-525794 dated Dec. 4, 2018 (five pages).
(Continued)

*Primary Examiner* — Lindsey A Bernier
(74) *Attorney, Agent, or Firm* — Crowell & Moring LLP

(57) ABSTRACT

A layer structure for a thin-film solar cell and production method are provided. The layer structure for the thin-film solar cell includes a photovoltaic absorber layer doped, at least in a region which borders a surface of the photovoltaic absorber layer, with at least one alkali metal. The layer structure has an oxidic passivating layer on the surface of the photovoltaic absorber layer, which is designed to protect the photovoltaic absorber layer from corrosion.

7 Claims, 2 Drawing Sheets

(51) Int. Cl.
*H01L 31/0392* (2006.01)
*H01L 31/0749* (2012.01)
*H01L 31/0445* (2014.01)
*H01L 31/18* (2006.01)
*H01L 21/02* (2006.01)
*H01L 31/0216* (2014.01)

(52) U.S. Cl.
CPC .... *H01L 31/0327* (2013.01); *H01L 31/03923* (2013.01); *H01L 31/03928* (2013.01); *H01L 31/0445* (2014.12); *H01L 31/062* (2013.01); *H01L 31/0749* (2013.01); *H01L 21/02565* (2013.01); *H01L 31/02167* (2013.01); *H01L 31/02168* (2013.01); *H01L 31/18* (2013.01); *H01L 31/1868* (2013.01); *Y02E 10/541* (2013.01); *Y02P 70/50* (2015.11)

(58) Field of Classification Search
CPC ........... H01L 31/03928; H01L 31/0749; Y02E 10/541
See application file for complete search history.

(56) References Cited

U.S. PATENT DOCUMENTS

| | | | |
|---|---|---|---|
| 2003/0160243 A1 | 8/2003 | Middelman et al. | |
| 2004/0084079 A1 | 5/2004 | Romero et al. | |
| 2010/0224247 A1 | 9/2010 | Bartholomeusz et al. | |
| 2010/0224249 A1* | 9/2010 | Fukunaga | C25D 11/04 136/259 |
| 2010/0276003 A1* | 11/2010 | Kawano | B82Y 30/00 136/261 |
| 2011/0192454 A1 | 8/2011 | Feist et al. | |
| 2011/0297227 A1 | 12/2011 | Pysch et al. | |
| 2012/0024366 A1 | 2/2012 | Liu et al. | |
| 2012/0055554 A1* | 3/2012 | Radu | B82Y 30/00 136/264 |
| 2012/0132281 A1 | 5/2012 | Yang et al. | |
| 2014/0124011 A1 | 5/2014 | Mitzi et al. | |
| 2014/0315348 A1 | 10/2014 | Sugimoto et al. | |
| 2014/0326311 A1 | 11/2014 | Yang et al. | |
| 2014/0338741 A1* | 11/2014 | Palm | H01L 31/03923 136/256 |
| 2015/0333200 A1 | 11/2015 | Chirila et al. | |

FOREIGN PATENT DOCUMENTS

| | | | |
|---|---|---|---|
| DE | 10 2008 045 522 A1 | 3/2010 | |
| DE | 10 2012 211 894 A1 | 1/2014 | |
| EP | 0 460 287 A1 | 12/1991 | |
| JP | 2013-118265 A | 6/2013 | |
| WO | WO-2013068702 A1 * | 5/2013 | ....... H01L 31/03923 |
| WO | WO 2014/097112 A1 | 6/2014 | |

OTHER PUBLICATIONS

International Search Report (PCT/ISA/210) issued in PCT Application No. PCT/EP2015/076996 dated Jan. 27, 2016 with English translation (Six (6) pages).

German-language Written Opinion (PCT/ISA/210) issued in PCT Application No. PCT/EP2015/076996 dated Jan. 27, 2016 (Six (6) pages).

Hindi-language Search Report issued in counterpart Indian Application No. 201737015237 dated Nov. 30, 2019 with English translation (six (6) pages).

* cited by examiner

LAYER STRUCTURE FOR A THIN-FILM SOLAR CELL AND PRODUCTION METHOD

BACKGROUND AND SUMMARY OF THE INVENTION

The invention pertains to a layer structure for a thin-film solar cell, comprising a photovoltaic absorber layer doped, at least in a region which borders a surface of the photovoltaic absorber layer, with at least one alkali metal. The invention further pertains to a method for producing a layer structure of this kind.

A generic layer structure and associated production method are known from WO 2014/097112 A1. Conventionally the layer structure with the photovoltaic absorber layer is integrated into the thin-film solar cell. Studies have shown that alkali metal doping may favorably influence the properties of the absorber layer—which typically comprises a compound semiconducting material—that are relevant to the photoelectric activity, and can lead to a marked improvement in the efficiency of the thin-film solar cell. However, the alkali metal doping is not without certain difficulties. In particular, the fill factor and hence also the efficiency of some thin-film solar cells of this kind may be reduced markedly by comparison with other thin-film solar cells of the same construction.

It is an object of the invention to provide a layer structure having improved chemical and physical properties in order to raise the efficiency of a thin-film solar cell with a layer structure of this kind, and also a method for producing a layer structure of this kind.

The invention achieves this object by providing a layer structure comprising a photovoltaic absorber layer doped, at least in a region bordering a surface of the photovoltaic absorber layer, with at least one alkali metal, and an oxidic passivating layer on the surface of the photovoltaic absorber layer, the oxidic passivating layer being designed to protect the photovoltaic absorber layer from corrosion.

The invention achieves this object also by providing a method for producing the layer structure, comprising the steps of generating a photovoltaic absorber layer, doped, at least in a region bordering a surface of the photovoltaic absorber layer, with at least one alkali metal, on a substrate, and of generating an oxidic passivating layer on the surface of the photovoltaic absorber layer, the oxidic passivating layer being designed to protect the photovoltaic absorber layer from corrosion.

The layer structure of the invention has an oxidic passivating layer on the surface of the photovoltaic absorber layer, which is designed to protect the photovoltaic absorber layer from corrosion.

The oxidic passivating layer comprises or consists of a material with an oxygen compound. The oxidic passivating layer may be constructed on the surface and/or may be built on the surface into the photovoltaic absorber layer. Being built in may mean that the photovoltaic absorber layer can be converted on the surface. The oxidic passivating layer covers the photovoltaic absorber layer without gaps; the oxidic passivating layer is uninterrupted. Besides the surface bordered by the doping region, the photovoltaic absorber layer may have an opposite interface with, for example, an electrical back contact layer.

Usually, the alkali metal introduced by doping renders an absorber layer material more susceptible, under ambient conditions, to chemical corrosion, at least in the region at the surface, especially if the absorber layer comprises compound semiconducting materials. The corrosion adversely affects the optoelectronic properties of the thin-film solar cell. As a result of the corrosion, as a consequence of redox events owing to exchange of electrons with atmospheric oxygen, or of hydrolysis processes, owing to interaction with moisture in the ambient air, materials defects may arise at the surface of the photovoltaic absorber layer, accompanied by the formation of three-dimensionally distributed individual oxides. These materials defects lead to an increase in the recombination of light-induced charge carriers. The three-dimensionally distributed oxides do not have a passivating effect. Nor do they protect the photovoltaic absorber layer from further corrosion, particularly in the volume of the photovoltaic absorber layer beneath the surface, as for example along grain boundaries of a polycrystalline absorber layer structure.

Frequently, as an alternative to a conventional CdS buffer layer (cadmium sulfide CdS), at least one oxygen-containing buffer layer is applied to the photovoltaic absorber layer during the further processing of the thin-film solar cell. Typically the buffer layer comprises an oxidic (e.g., zinc oxide ZnO, zinc magnesium oxide ZnMgO) and/or oxosulfidic (e.g., zinc oxosulfide Zn(O,S)) material or consists of at least one of these materials. These purely or partially oxidic materials or applied oxygen-containing buffer layers are not capable of providing the photovoltaic absorber layer with adequate protection from corrosion.

The oxidic passivating layer of the invention permits effective protection of the photovoltaic absorber layer, comprising the alkali metal doping, from corrosion and, in association therewith, from the formation of electrically active impurities, particularly during further layer-structure and/or thin-film solar-cell processing prior to encapsulation of the thin-film solar cell, and/or in the case of an imperfectly sealing encapsulation, for a longer term. Protection from corrosion comprehends at least a retardation of the corrosion process in terms of time. Moreover, the oxidic passivating layer allows a reduction in or prevention of the recombination of light-induced charge carriers on the surface of the photovoltaic absorber layer. The oxidic passivating layer may more particularly be designed to prevent a photocurrent loss at the surface or interface of the photovoltaic absorber layer. In other words, the oxidic passivating layer may be designed to saturate unsaturated bonds, known as "dangling bonds", in particular through formation of oxygen compounds, to prevent formation of positive charges at the surface or interface, and/or to avoid electrical activity at the surface. In this way the advantages of the alkali metal doping can be exploited, and its disadvantages avoided, so that the efficiency of the thin-film solar cell thus produced is particularly high and ideally remains high during the entire lifetime of the thin-film solar cell.

Furthermore, the application of a buffer layer, composed of CdS, Zn(O,S) or $In_2S_3$, for example, may be promoted by the oxidic passivating layer, thereby making it possible to enhance the quality of the buffer layer and hence to reduce the buffer layer thickness. The oxidic passivating layer, furthermore, may act as a weak diffusion barrier with respect to atom/ion diffusion in the interface region between photovoltaic absorber layer and buffer layer.

In a development of the invention, the photovoltaic absorber layer comprises a chalcopyrite material, and specifically $Cu(In_{1-x}Ga_x)(Se_{1-y}S_y)_2$ (copper Cu, indium In, gallium Ga, selenium Se, sulfur S) where $0 \leq x, y \leq 1$, and/or a kesterite material such as $Cu_2ZnSn(Se_{1-x}S_x)_4$ (tin Sn) where $0 \leq x \leq 1$, or consists of at least one of these materials. These compound semiconducting materials have direct electrical band gaps of a few eV (electron-volts). Furthermore, they can be doped effectively with alkali metals. They are therefore of ideal suitability for use in thin-film solar cells.

Compound semiconductor layers are typically slightly p-doped owing to intrinsic defects. Conventionally a p-n inversion in the thin-film solar cell is achieved by applying a ZnO layer, heavily n-doped with Al (aluminum), to the at least one aforementioned buffer layer. By the p-n inversion an electrical field is generated across the layers of the thin-film solar cell, and by this electron-hole pairs generated by photon absorption can be spatially separated. In a development of the invention, the region bordering the surface of the photovoltaic absorber layer is doped in such a way as to exhibit a p-n inversion. This can be achieved by a suitable doping profile with a correspondingly high doping throughout the doping region. As a result, electron-hole pairs generated in the photovoltaic absorber layer may be separated even more effectively. More particularly it is possible to reduce recombination of the electron-hole pairs. Thus an increase can be achieved in the efficiency of the thin-film solar cell. The photovoltaic absorber layer may advantageously be n-doped on the surface.

The alkali metals utilized to date to dope the photovoltaic absorber layer are sodium (Na) and potassium (K). Na generally does not achieve p-n inversion in the region at the surface. Increasing the efficiency of the thin-film solar cell with K is volatile; in other words, the reproducibility of thin-film solar cells of this kind with high efficiency is low. In one development of the invention, the at least one alkali metal is rubidium Rb and/or cesium Cs. These alkali metals may be fixed on the surface of the photovoltaic absorber layer, thereby making it possible to achieve p-n inversion in the region on the surface of the photovoltaic absorber layer. Surprisingly it turns out that the efficiency of thin-film solar cells with these specific alkali metals can be increased significantly, and the reproducibility of the increased efficiencies is improved.

In a development of the invention, the oxidic passivating layer comprises $(In,Ga)_2O_3$, $M_x(In,Ga)_yO_z$ (oxygen O) where M=K, Rb, Cs and where 0<x, y, z and/or aluminum oxide $Al_2O_3$ or consists of at least one of these materials. Alternatively or additionally, the oxidic passivating layer may comprise ZnO and/or $SnO_x$ where x=1 to 2 and/or a mixture of both materials, or may consist of at least one of these materials, and alkali metal fractions may also be present by diffusion from the surface or interface. In other words, the stated materials may in each case not be present in doping-quantity concentration, but instead in stoichiometric quantities. For a photovoltaic absorber layer which consists of or comprises a chalcopyrite material, the oxidic passivating layer, with $(In,Ga)_2O_3$, $M_x(In,Ga)_yO_z$, for example, may be generated or grown from the photovoltaic absorber layer and oxygen; in this case, the surface of the photovoltaic absorber layer may be converted. For a photovoltaic absorber layer which consists of or comprises a kesterite material, the oxidic passivating layer, with ZnO, $SnO_x$, for example, may be grown or generated from the photovoltaic absorber layer and oxygen; in that case the surface of the photovoltaic absorber layer may be converted. Additionally or alternatively, the oxidic passivating layer with $Al_2O_3$ may be generated by application of $Al_2O_3$ to the photovoltaic absorber layer. In particular, $Al_2O_3$ may protect not only Al layers but also other material layers from corrosion.

In a development of the invention, a thickness of the oxidic passivating layer is in the range from 1 nm to 50 nm (nanometers), preferably in the range from 3 nm to 5 nm. By this means it is possible on the one hand to achieve effective protection of the photovoltaic absorber layer from corrosion. On the other hand, effective electrical transport from the photovoltaic absorber layer through the oxidic passivating layer and to an optional buffer layer and/or a front contact layer can still be ensured. In the case of generation or growth of the oxidic passivating layer from the photovoltaic absorber layer and oxygen, such generation or growth is promoted by the presence of the at least one alkali metal, preferably by Rb and/or Cs, and so the thickness in the stated range can be achieved without damage to the remainder of the photovoltaic absorber layer. In contrast, in the case of a photovoltaic absorber layer without alkali metal doping, growth of an oxide layer having a thickness above a submonolayer range from this layer and oxygen is not even possible at all or, if it is forced by means of high temperatures and long growth periods, takes place with damage to the photovoltaic absorber layer, in which case the oxide layer is not coherent and also has no passivating effect. Damage to the photovoltaic absorber layer means that the photovoltaic absorber layer loses its semiconducting properties and therefore can no longer be used for a thin-film solar cell.

In the method of the invention for producing the layer structure of the invention, in a step a, the photovoltaic absorber layer, which is doped, at least in the region bordering the surface of the photovoltaic absorber layer, with the at least one alkali metal, is generated on a substrate. Simultaneously or thereafter, furthermore, in a step b, the oxidic passivating layer is formed on the surface of the photovoltaic absorber layer, specifically such that it protects the photovoltaic absorber layer from corrosion and, in association therewith, from the formation of electrically active impurities. Step b may preferably comprise the building of the oxidic passivating layer on the surface into the photovoltaic absorber layer, for which the photovoltaic absorber layer may be converted on the surface. Step b may also follow step a immediately, i.e., without a step in between.

Step a may comprise growing of the photovoltaic absorber layer on a substrate to which the at least one alkali metal has been added, and diffusing of the at least one alkali metal from the substrate into the photovoltaic absorber layer at relatively high temperatures. Alternatively or additionally, step a may comprise applying an alkali metal fluoride precursor to a substrate, growing the photovoltaic absorber layer on the substrate, and diffusing the at least one alkali metal from the alkali metal fluoride precursor into the photovoltaic absorber layer at relatively high temperatures.

In a development of the invention, step a comprises, as a substep ax, the generation of a photovoltaic absorber layer, and, as a substep az, doping of the photovoltaic absorber layer, at least in the region bordering the surface of the photovoltaic absorber layer, with the at least one alkali metal. Sub step az may begin at the same time as substep ax or may begin after it, before it or when substep ax has fully concluded. Moreover, the substep az may finish simultaneously with substep ax or after it. The at least one alkali metal may be provided by means of an alkali metal fluoride, e.g., RbF and/or CsF, and/or of other alkali metal compounds, e.g., alkali metal oxides, alkali metal carbonates, alkali metal selenides and/or other alkali metal halides, such as RbCl, CsCl, RbBr, CsBr, RbI and/or CsI. With this method it is possible in particular with Rb and/or Cs to generate a p-n inversion in the region bordering the surface of the photovoltaic absorber layer.

In an embodiment of the invention, the method may comprise a step for applying the at least one alkali metal to the surface of the photovoltaic absorber layer. The step ax may have been concluded entirely before this step, which may then be referred to as a post-deposition treatment (PDT). The alkali metal may be applied by vapor deposition in the form, for example, of alkali metal fluoride and/or of another alkali metal compound, under an Se atmosphere and/or S atmosphere, to the surface of the photovoltaic absorber. At the same time or thereafter, the step az may be carried out, in the form of diffusing of the at least one alkali metal, at least into the region bordering the surface of the photovoltaic absorber layer, more particularly and in some cases forcibly under an Se atmosphere and/or S atmosphere. In that case the photovoltaic absorber layer may be heated to at least 350° C. In the case of an alkali metal fluoride, during vapor deposition and diffusing under an Se atmosphere and/or S atmosphere, the fluorine may enter into a chemical bond with Se and/or S outside the photovoltaic absorber layer, so that only the alkali metal, and not F, is able to diffuse into the photovoltaic absorber layer. For other alkali metal compounds a similar mechanism may take place.

In a development of the invention, step b comprises annealing the alkali metal-doped absorber layer, at a temperature elevated relative to room temperature, in an oxygen-containing atmosphere. In the case of a photovoltaic absorber layer which consists of or comprises a chalcopyrite, it is possible in this way in particular to generate or grow the oxidic passivating layer with $(In,Ga)_2O_3$, $M_x(In,Ga)_yO_z$; the surface of the photovoltaic absorber layer may be converted in this case. More particularly it is possible by this means, in the case of a photovoltaic absorber layer consisting of or comprising a kesterite material, to generate or grow the oxidic passivating layer with $ZnO$, $SnO_2$; in that case the surface of the photovoltaic absorber layer may be converted. The $ZnO/SnO_x$ mixed oxide layer may also comprise alkali metals, as a result of diffusion processes at the surface or interface. Relative to room temperature, the temperature for the annealing process is increased by at least 80 kelvins. Annealing may be carried out preferably at not less than about 120° C., more particularly in the range from 120° C. to 250° C. The annealing may last for at least 1 minute up to a maximum of 30 minutes. The annealing may be carried out under an oxygen partial pressure of at least $10^{-1}$ mbar, preferably in a range from 1 mbar up to the partial pressure of oxygen in ambient air.

In a development of the invention, step b comprises applying an oxide to the surface of the photovoltaic absorber layer with alkali metal doping. The oxide may more particularly comprise $Al_2O_3$.

In a development of the invention, the method comprises a step for applying the buffer layer, of CdS, Zn(O,S) or $In_2S_3$, for example, to the oxidic passivating layer.

BRIEF DESCRIPTION OF THE DRAWINGS

Advantageous embodiments of the invention are set out in the drawings and are described below. In these drawings.

DETAILED DESCRIPTION OF THE DRAWINGS

Figure 1:
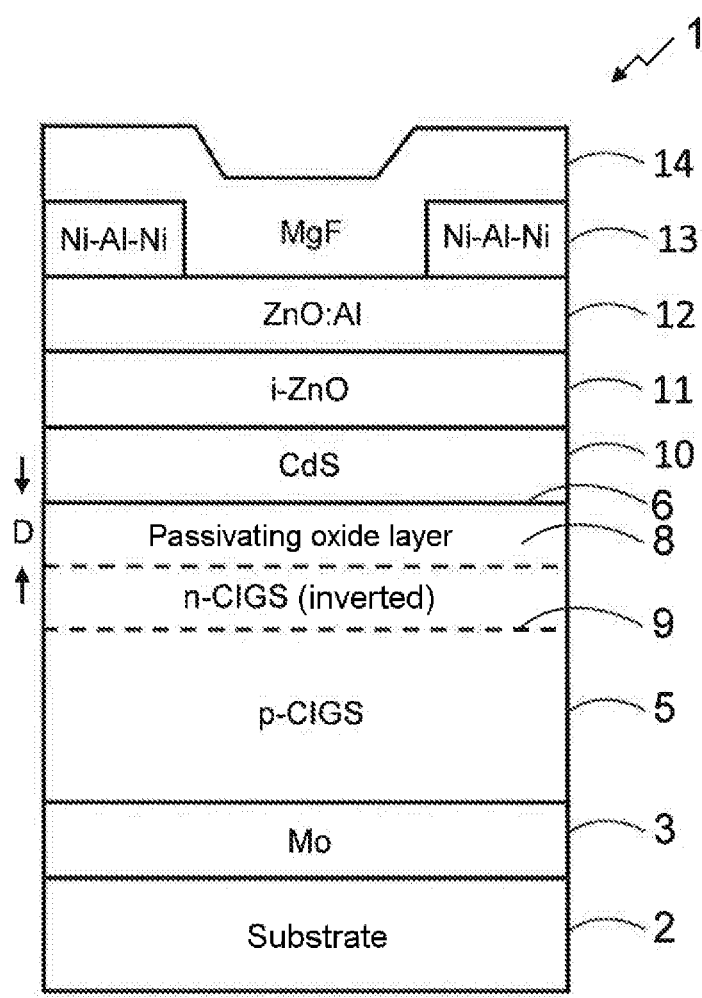
FIG. 1 shows a schematic cross-sectional view through a thin-film solar cell.
Figure 2:
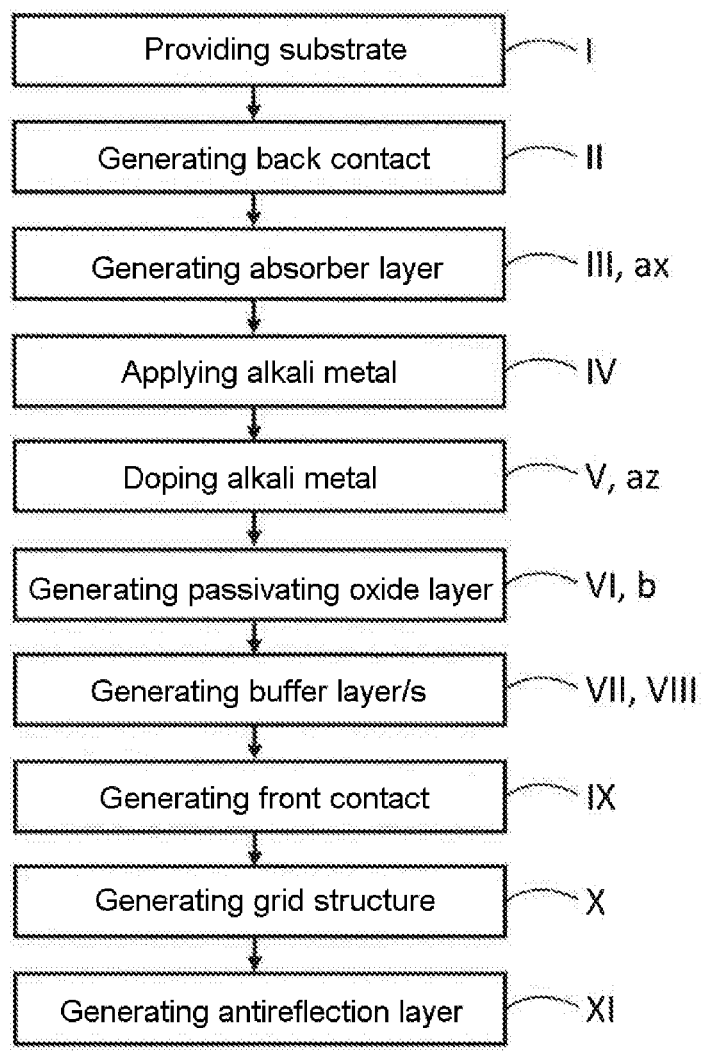
FIG. 2 shows a flow diagram of a method for producing the thin-film solar cell of FIG. 1.

FIG. 1 shows a schematic cross-sectional view through a thin-film solar cell 1 according to an advantageous embodiment. In a flow diagram, FIG. 2 shows the essential steps that are of interest here in an exemplary production method for the thin-film solar cell 1. In a first step I, a substrate 2 made of glass, for example, is provided. In a second step II a Mo layer 3 (molybdenum), which is intended to serve as back contact for the thin-film solar cell 1, is applied by cathodic sputtering under reduced pressure to the glass substrate 2, in a thickness of around 500 nm, for example.

Thereafter, in a co-vaporization process (step III, ax), the elements Cu, In, Ga, and Se are applied by vapor deposition at a temperature of the glass substrate 2 of around 600° C., for example. In this way a photovoltaic absorber layer 5, consisting of the compound semiconductor material Cu(In, Ga)Se$_2$ (CIGS), grows on the Mo layer 3, in a thickness of 2 μm to 3 μm (micrometers), for example. At this point in time, the photovoltaic absorber layer 5 is slightly p-doped everywhere, owing to intrinsic defects in the CIGS material and owing to a possible extrinsic doping with sodium and potassium from the glass substrate, if present there.

After the photovoltaic absorber layer 5 has been generated, RbF and/or CsF is applied by vapor deposition under reduced pressure from a vaporization crucible at crucible temperatures of at least about 400° C. onto a surface 6 of the photovoltaic absorber layer 5 (step IV). At slightly elevated temperature of the glass substrate 2, of around at least 350° C., the at least one alkali metal diffuses into the photovoltaic absorber layer 5 (step V, az). In this procedure, on account of their greater ionic radius, Rb and/or Cs atoms/ions irreversibly displace Cu atoms from the surface 6 in the direction of the molybdenum layer 3 into the volume of the photovoltaic absorber layer 5. Because of this exchange, the maximum alkali metal concentration is found close to the surface in the photovoltaic absorber layer 5. This leads to a p-n inversion 9 in the photovoltaic absorber layer 5 in the vicinity of the surface 6. The Rb or Cs penetrates into the volume of the photovoltaic absorber layer 5, preferably along grain boundaries in the CIGS material, up to the molybdenum layer 3, where it may partially displace sodium and potassium, if present. Steps IV and V in this case are PDT processes. In an alternative embodiment, RbF and/or CsF may be applied by vapor deposition under an Se atmosphere and/or S atmosphere. Alternatively or additionally, the at least one alkali metal may diffuse into the photovoltaic absorber layer under an Se atmosphere and/or S atmosphere.

Thereafter an oxidic passivating layer 8 is generated on the surface 6 of the photovoltaic absorber layer 5 by annealing of the layer structure generated so far, in ambient air (step VI, b), at around 200° C., for example. In this process, oxygen on the surface 6 is built into the alkali-metal-doped CIGS material; the photovoltaic absorber layer 5 is converted on the surface 6. The oxidic passivating layer 8 in that case, for example, comprises the materials $(In,Ga)_2O_3$ and $M_x(In,Ga)_yO_z$ where M=Rb and/or Cs and where 0<x, y, z. The oxidic passivating layer 8 extends over a thickness D of, for example, around 3 nm to 5 nm into the photovoltaic absorber layer 5 in FIG. 1 downwardly. The oxidic passivating layer 8 protects the major remaining part of the photovoltaic absorber layer 5 from corrosion, especially during the further production of the thin-film solar cell 1.

Subsequently a CdS buffer layer 10 around 30 nm to 50 nm thick is deposited or grown, in a chemical deposition bath, on the surface 6 of the photovoltaic absorber layer 5 and/or of the oxidic passivating layer 8 (step VII). Because of a change in the surface polarity of the absorber layer 5, the oxidic passivating layer 8 promotes the growth of the CdS buffer layer 10 and enhances its quality.

There follows an undoped i-ZnO layer 11, around 50 nm to 100 nm thick, by sputtering under vacuum (step VIII), and a ZnO:Al layer 12 around 150 nm to 250 nm thick, heavily n-doped with aluminum (step IX). The CdS buffer layer 10 and the i-ZnO layer 11 ensure band matching between the CIGS material of the photovoltaic absorber layer 5 and the ZnO:Al layer 12. The ZnO:Al layer 12 is transparent and conductive and is intended to serve as the front contact of the thin-film solar cell 1.

Applied to the ZnO:Al layer 12 are an Ni—Al—Ni grid structure 13 (nickel Ni) approximately several μm thick (step X) and an antireflection layer 14 of MgF (step XI).

Efficiencies of up to 21.7% could be measured on a thin-film solar cell 1 produced as described.

In the embodiment shown, the photovoltaic absorber layer comprises CIGS material. Additionally or alternatively, the photovoltaic absorber layer may comprise other compound semiconductor materials or may consist thereof, more particularly $Cu(In_{1-x}Ga_x)(Se_{1-y}S_y)_2$ and/or $Cu_2ZnSn(Se_{1-x}S_x)_4$, which can be produced by co-vaporization of the stated elements or selenization/sulfurization of precursor layers onto an Mo-coated substrate (e.g., glass, metal, ceramic, plastic).

Furthermore, the photovoltaic absorber layer need not be completely doped or have a p-n inversion; at least one region, which borders the surface of the photovoltaic absorber layer, is doped with the at least one alkali metal. Moreover, the doping of the photovoltaic absorber layer of at least one alkali metal may be generated, in at least one region bordering the surface of the photovoltaic absorber layer, by other conventional processes rather than the aforementioned PDT process.

Alternatively or additionally to RbF and/or CsF, moreover, the at least one alkali metal may be provided by means of a different alkali metal fluoride and/or different alkali metal compounds, examples are alkali metal oxides, alkali metal carbonates, alkali metal selenides and/or other alkali metal halides, such as RbCl, CsCl, RbBr, CsBr, RbI and/or CsI.

The oxidic passivating layer, alternatively or additionally to the materials $(In,Ga)_2O_3$ and $M_x(In,Ga)_yO_z$ where M=Rb and/or Cs, may comprise or consist of the material $Al_2O_3$, and $Al_2O_3$ can be applied to the surface of the photovoltaic absorber layer. Further alternatively or additionally, particularly for a photovoltaic absorber layer which consists of or comprises a kesterite material, the oxidic passivating layer may comprise ZnO and/or $SnO_x$ where x=1 to 2, and/or a mixture of both materials, or may consist of at least one of these materials, in which case alkali metal fractions may also be present as a result of diffusion from the surface or interface.

Alternatively or additionally to CdS, the buffer layer applied to the oxidic passivating layer may comprise or consist of a different material, more particularly Zn(O,S) and/or $In_2S_3$, which may be deposited in a chemical deposition bath or through a gas-phase process.

Alternatively or additionally to i-ZnO material, the layer applied to the CdS buffer layer may comprise $i-Zn_{1-x}Mg_xO$ where 0≤x≤0.4, or may consist of this material, which can be applied by cathodic sputtering similarly to the i-ZnO.

By optimizing the thickness and the optoelectronic properties of the passivating oxide layer (combination of materials, doping, band gap, etc.), it may not only meet chemical requirements (e.g., protecting the photovoltaic absorber layer from corrosion) but may also, furthermore, meet physical requirements, such as band matching between the material of the photovoltaic absorber layer and the layer of the front contact, for example. Accordingly it is possible to omit the subsequent buffer layer and/or the i-ZnO and/or ZnMgO layer. There have already been multiple demonstrations of conventional CIGS solar cells in which, on the basis of optimization of the thickness and of deposition process of the CdS and/or Zn(O,S) buffer layer, it has been possible to omit the subsequent i-ZnO and/or i-ZnMgO layer.

As the embodiments shown and those explained above make clear, the invention provides an advantageous layer structure for a thin-film solar cell, comprising, on a surface of a photovoltaic absorber layer, an oxidic passivating layer which is designed so as to protect the photovoltaic absorber layer from corrosion, thereby allowing the efficiency of the thin-film solar cell to be increased.

The invention claimed is:

1. A layer structure for a thin-film solar cell, comprising:
a photovoltaic absorber layer including a first region at a first end of the photovoltaic absorber layer that has been converted from a surface portion of the photovoltaic absorber layer into an oxidic passivating region and a second region at a second end of the photovoltaic absorber layer that is opposite from the first end, the photovoltaic absorber layer being doped, at least in the first region, with at least one alkali metal,
wherein the oxidic passivating region is corrosion-resistant, wherein
the photovoltaic absorber layer comprises $Cu(In_{1-x}Ga_x)(Se_{1-y}S_y)_2$, where 0≤x,y≤1, and $Cu_2ZnSn(Se_{1-x}S_x)_4$, where 0≤x≤1, and the oxidic passivating region further comprises at least one of $(In,Ga)_2O_3$ and $M_x(In,Ga)_yO_z$, where M=K, Rb, Cs and where 0<x, y, z, or
the photovoltaic absorber layer comprises $Cu_2ZnSn(Se_{1-x}S_x)_4$, where 0≤x≤1, and the oxidic passivating region further comprises $SnO_x$, where x=1 to 2.

2. The layer structure as claimed in claim 1, wherein an upper end of the second region of the photovoltaic absorber layer is doped such that it exhibits a p-n inversion.

3. The layer structure as claimed in claim 1, wherein the at least one alkali metal is at least one of rubidium and cesium.

4. The layer structure as claimed in claim 1, wherein the oxidic passivating region comprises at least one of $(In,Ga)_2O_3$ and $M_x(In,Ga)_yO_z$, where M=K, Rb, Cs and where 0<x, y, z, and the oxidic passivating region further comprises $Al_2O_3$, ZnO, and $SnO_x$ where x=1 to 2.

5. The layer structure as claimed in claim 1, wherein a thickness of the oxidic passivating region is in the range from 1 nm to 50 nm.

6. The layer structure as claimed in claim 1, wherein the oxidic passivating region bears an applied buffer layer.

7. The layer structure as claimed in claim 1, wherein the oxidic passivating region further comprises ZnO.

* * * * *